(12) United States Patent
Su et al.

(10) Patent No.: US 11,393,685 B2
(45) Date of Patent: Jul. 19, 2022

(54) SEMICONDUCTOR STRUCTURE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Bo Su, Shanghai (CN); Shiliang Ji, Shanghai (CN); Erhu Zheng, Shanghai (CN); Yan Wang, Shanghai (CN); Haiyang Zhang, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 17/029,255

(22) Filed: Sep. 23, 2020

(65) Prior Publication Data

US 2021/0134595 A1 May 6, 2021

(30) Foreign Application Priority Data

Nov. 6, 2019 (CN) .......................... 201911075253.4

(51) Int. Cl.
| | | |
|---|---|---|
| H01L 21/033 | (2006.01) | |
| H01L 21/02 | (2006.01) | |
| H01L 21/311 | (2006.01) | |
| H01L 21/308 | (2006.01) | |

(52) U.S. Cl.
CPC ...... *H01L 21/0337* (2013.01); *H01L 21/0217* (2013.01); *H01L 21/0234* (2013.01); *H01L 21/3086* (2013.01); *H01L 21/31116* (2013.01); *H01L 21/31144* (2013.01)

(58) Field of Classification Search
None
See application file for complete search history.

(56) References Cited

U.S. PATENT DOCUMENTS

| | | | | |
|---|---|---|---|---|
| 2013/0084688 | A1* | 4/2013 | O'Meara ............. | H01L 21/0338 438/478 |
| 2015/0001687 | A1* | 1/2015 | Zhang ................. | H01L 21/0337 257/622 |
| 2016/0293420 | A1* | 10/2016 | Tang .................. | H01L 21/3086 |
| 2016/0336178 | A1* | 11/2016 | Swaminathan ..... | H01L 21/0332 |
| 2017/0243754 | A1* | 8/2017 | Tavernier ............ | H01L 21/3105 |
| 2021/0005456 | A1* | 1/2021 | Sung .................. | H01L 21/0337 |

\* cited by examiner

*Primary Examiner* — Roberts P Culbert
(74) *Attorney, Agent, or Firm* — Anova Law Group, PLLC (57) ABSTRACT

The present disclosure provides a method for forming a semiconductor structure. The method includes providing a to-be-etched layer; forming a plurality of initial sidewall spacers on the to-be-etched layer; and performing at least one modification treatment process on the plurality of initial sidewall spacers to form a plurality of sidewall spacers. Each of the at least one modification treatment process includes modifying the plurality of initial sidewall spacers to form a transition layer on the top and sidewall surfaces of each initial sidewall spacer of the plurality of initial sidewall spacers, and then removing the transition layer.

18 Claims, 7 Drawing Sheets

SEMICONDUCTOR STRUCTURE AND FABRICATION METHOD THEREOF

CROSS-REFERENCE TO RELATED APPLICATIONS

This application claims the priority of Chinese Patent Application No. CN201911075253.4, filed on Nov. 6, 2019, the entire content of which is incorporated herein by reference.

FIELD OF THE DISCLOSURE

The present disclosure generally relates to the field of semiconductor manufacturing and, more particularly, relates to semiconductor structures and fabrication methods thereof.

BACKGROUND

With development of semiconductor manufacturing technology, various methods, such as self-aligned double patterning (SADP), self-aligned quadra patterning (SAQP), etc. have been exploited to reduce the critical dimension (CD), and to thus increase the integration density of semiconductor chips with higher operation speed, higher information storage capacity, etc.

Although SADP and SAQP may be used to increase pattern density by multiple times, the device performance of semiconductor devices formed by the existing fabrication methods may be undesired due to the manufacturing limitations of the SADP and SAQP techniques. The disclosed semiconductor structures and fabrication methods thereof are directed to solve one or more problems set forth above and other problems in the art.

BRIEF SUMMARY OF THE DISCLOSURE

One aspect of the present disclosure provides a method for forming a semiconductor structure. The method includes providing a to-be-etched layer; forming a plurality of initial sidewall spacers on the to-be-etched layer; and performing at least one modification treatment process on the plurality of initial sidewall spacers to form a plurality of sidewall spacers. Each of the at least one modification treatment process includes modifying the plurality of initial sidewall spacers to form a transition layer on the top and sidewall surfaces of each initial sidewall spacer of the plurality of initial sidewall spacers, and removing the transition layer.

Optionally, removing the transition layer includes performing an atomic layer etching process.

Optionally, the surface roughness of the plurality of initial sidewall spacers is a first roughness, and the surface roughness of the plurality of sidewall spacers is a second roughness. The first roughness is larger than the second roughness.

Optionally, each initial sidewall spacer of the plurality of initial sidewall spacers has an apex angle at top; and each sidewall spacer of the plurality of sidewall spacers has a rounded angle at top.

Optionally, modifying the plurality of initial sidewall spacers includes a plasma treatment process.

Optionally, the plurality of initial sidewall spacers is made of silicon nitride ($SiN_x$); and the gas used in the modification treatment process includes oxygen ($O_2$).

Optionally, the processing parameters of the plasma treatment process include a processing gas including $O_2$, Ar, and $C_4H_6$; a pressure in a range of approximately 10 mTorr to 50 mTorr; a gas flow rate of each of $O_2$, Ar, and $C_4H_6$ in a range of approximately 5 sccm to 800 sccm; a radio frequency (RF) power in a range of approximately 30 W to 500 W; and a bias power in a range of approximately 10 W to 200 W.

Optionally, passivating the transition layer to convert at least a portion of the transition layer into a passivated transition layer using a passivation gas to react with a surface of the transition layer; and etching the passivated transition layer using an etching gas to react with the passivated transition layer to remove the passivated transition layer.

Optionally, removing the transition layer includes repeatedly performing passivating the transition layer and etching the passivated transition layer.

Optionally, the transition layer is made of a material including Si—O—N group.

Optionally, the passivation gas includes a carbon fluoride gas, including $C_4F_6$, $CH_3F$, $CHF_3$, or a combination thereof.

Optionally, the etching gas includes argon (Ar) or helium (He).

Optionally, a bias power used in the atomic layer etching process is in a range of approximately 10 W to 250 W.

Optionally, the to-be-etched layer includes a substrate and a buffer layer formed on the substrate.

Optionally, forming the plurality of initial sidewall spacers includes forming a sacrificial layer, including a plurality of discrete portions; forming a sidewall material film on the surface of the to-be-etched layer and on the top and sidewall surfaces of the sacrificial layer; etching back the sidewall material film until exposing the surface of the to-be-etched layer and the top surface of the sacrificial layer to form the plurality of initial sidewall spacers; and removing the sacrificial layer after forming the plurality of initial sidewall spacers.

Optionally, the sacrificial layer is formed by a self-aligned multiple patterning process.

Optionally, after forming the plurality of sidewall spaces, the method further includes etching the to-be-etched layer using the plurality of sidewall spacers as an etch mask.

Optionally, the method further includes after forming the plurality of sidewall spacers, forming a plurality of additional sidewall spacers on a surface of the to-be-etched layer to cover a sidewall surface of each sidewall spacer; after forming the plurality of additional sidewall spacers, removing the plurality of sidewall spacers; and etching the to-be-etched layer using the plurality of additional sidewall spacers as an etch mask.

Optionally, forming the plurality of additional sidewall spacers includes forming an additional sidewall material film on the surface of the to-be-etched layer and on top and sidewall surfaces of each sidewall spacer; and etching back the additional sidewall material film until exposing the top surface of the sidewall spacer and the surface of the to-be-etched layer to form the plurality of additional sidewall spacers.

Another aspect of the present disclosure provides a semiconductor structure. The semiconductor structure is formed by the method according to the present disclosure, and includes the to-be-etched layer; and the plurality of sidewall spacers disposed on the to-be-etched layer.

Compared to existing semiconductor structures and fabrication methods, the disclosed semiconductor structures and fabrication methods may demonstrate the following exemplary advantages.

According to the disclosed methods, forming the transition layer by performing a modification treatment process on the plurality of initial sidewall spacers can improve the top morphology of each initial sidewall spacer. In the meantime, the transition layer can also reduce the roughness of the sidewall surfaces of the plurality of initial sidewall spacers. By using an atomic layer etching process to remove the transition layer, the transition layer can be etched at an atomic level, and thus the transition layer may be accurately removed. As such, desired top morphology may be ensured for the formed sidewall spacer, and the roughness of the surface of the sidewall surface of the formed sidewall spacer may be reduced. Therefore, the disclosed method may be able to form a plurality of sidewall spacers with desired top morphology and a small sidewall roughness, which may further improve the performance of the formed semiconductor structure.

Further, by performing a modification treatment process, a surface portion of each initial sidewall spacer is converted to a transition layer, that is, a surface portion of each initial sidewall spacer is consumed. Further, after subsequently removing the transition layer to form a plurality of sidewall spacers, the dimension of the formed sidewall spacer may be smaller than the dimension of the initial sidewall spacer, which may be conductive to forming a semiconductor structure with further reduced critical dimension, thereby improving the performance of the formed semiconductor structure.

Further, by performing the modification treatment process, when the processing gas used for the modification treatment reacts with the top portion of each initial sidewall spacer to form the transition layer, because of the apex angle at the top of each initial sidewall spacer, the degree of the reaction between the processing gas and the protruding portion at the top of each initial sidewall spacer may be greater than the degree of the reaction between the processing gas and the non-protruding portion of the initial sidewall spacer, such that the difference between the top protruding portion and the smooth portion may be reduced. Therefore, the top morphology of the formed initial sidewall spacer may be improved, and thus after removing the transition layer in a subsequent process, the formed sidewall spacer 40 may have a rounded angle at the top. That is, the profile of the sidewall spacer may be improved, which may further ensure desired performance of the formed semiconductor structure.

Further, during the modification treatment process, when the processing gas reacts with the sidewall of the initial sidewall spacer to form the transition layer, due to the uneven surface of the initial sidewall spacer, the degree of the reaction between the processing gas and the protruding portion of the sidewall surface may be greater than the degree of the reaction between the processing gas and the recessed portion of the sidewall surface, such that the difference between the protruding portion and the recessed portion may be reduced. Therefore, the roughness of the initial sidewall spacer may be reduced, and thus a second roughness of the sidewall spacer formed after subsequently removing the transition layer may be smaller than the first roughness. As such, the modification treatment process may be conductive to improving the performance of the formed semiconductor structure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the present disclosure, which are illustrated in the accompanying drawings. Wherever possible, the same reference numbers will be used throughout the drawings to refer to the same or like parts.

FIGS. 1-5 illustrate schematic cross-sectional views of semiconductor structures at certain stages of a fabrication process of a semiconductor structure.

Figure 1:
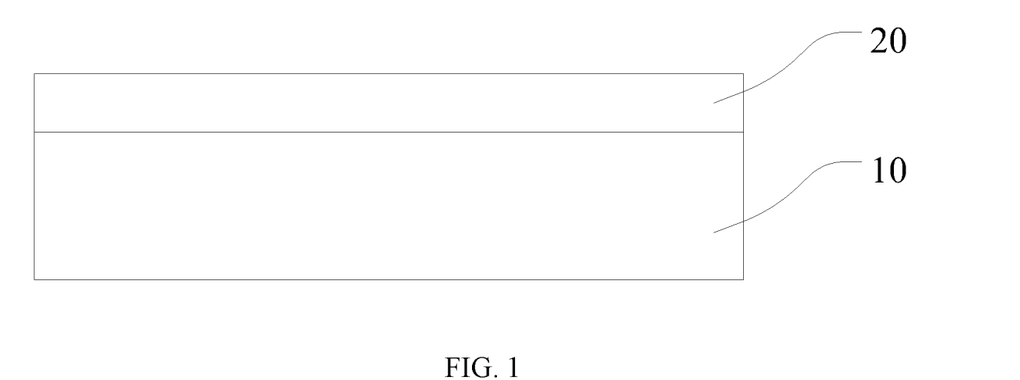
FIGS. 1-5 illustrate schematic cross-sectional views of semiconductor structures at certain stages of a fabrication process of a semiconductor structure.

Referring to FIG. 1, a to-be-etched layer 20 is formed on a semiconductor substrate 10.

Figure 2:
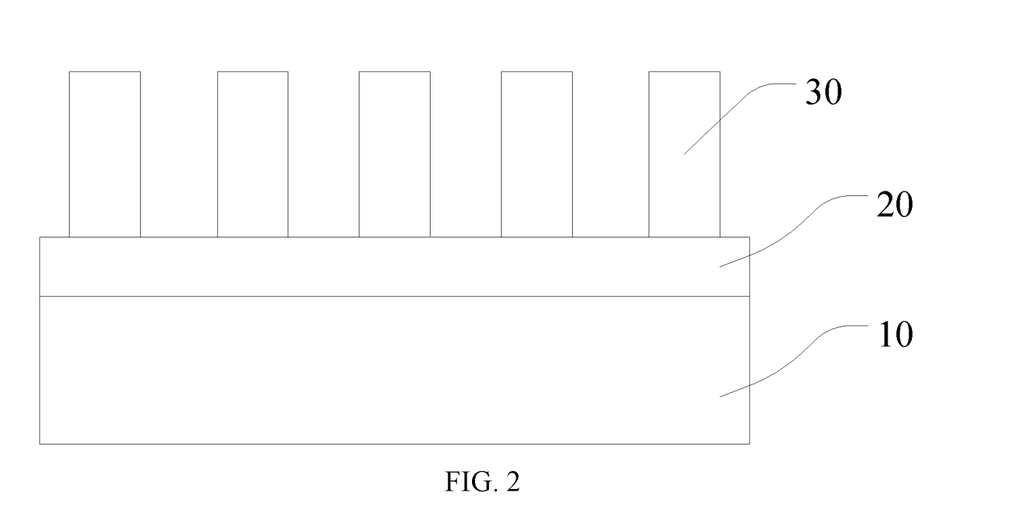

Referring to FIG. 2, a to-be-etched sacrificial material layer (not shown) is formed on the surface of the to-be-etched layer 20. Then, a patterned sacrificial layer 30 is formed by etching the to-be-etched sacrificial material layer. The patterned sacrificial layer 30 exposes a portion of the surface of the to-be-etched layer 20.

Figure 3:
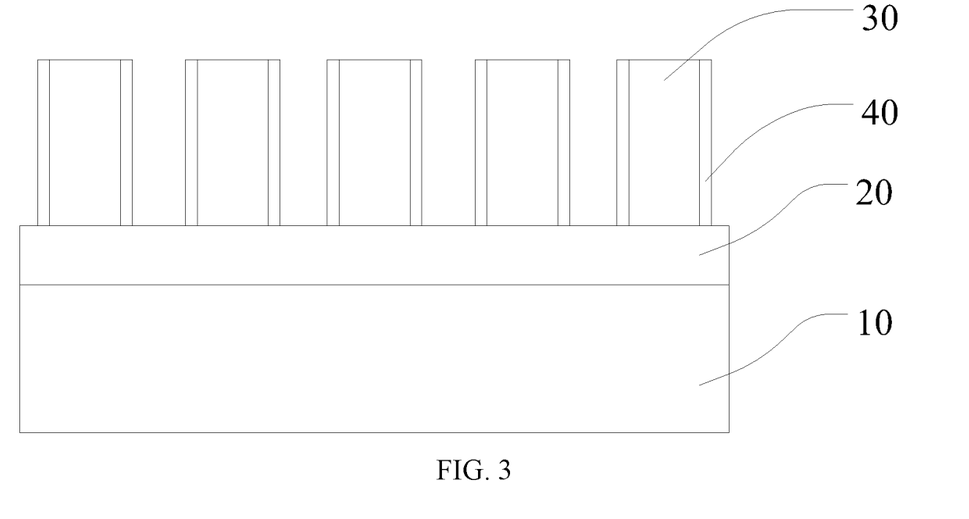

Referring to FIG. 3, a sidewall spacer material layer (not shown) is formed on the top and sidewall surfaces of the patterned sacrificial layer 30 and also on the surface of the to-be-etched layer 20. The sidewall spacer material layer is then etched to form a sidewall 40 on each sidewall surface of the patterned sacrificial layer 30.

Figure 4:
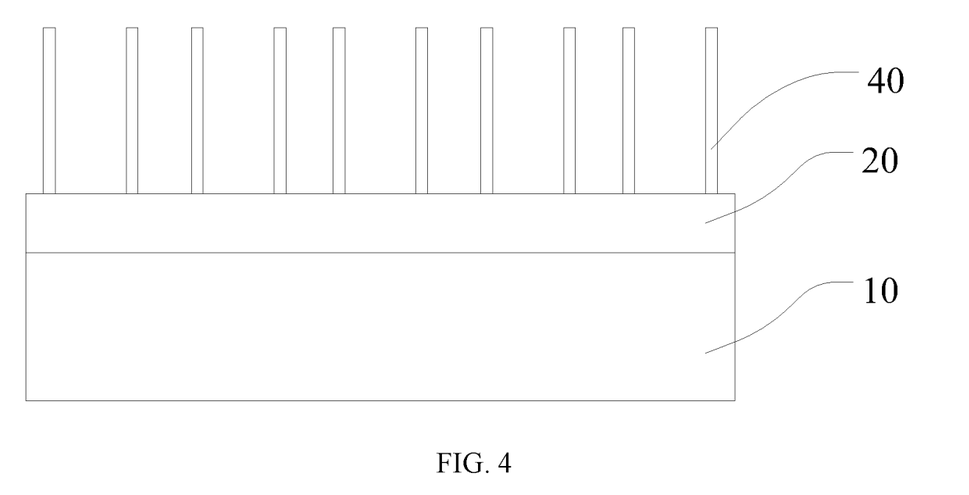

Referring to FIG. 4, the patterned sacrificial layer 30 is then removed.

Figure 5:
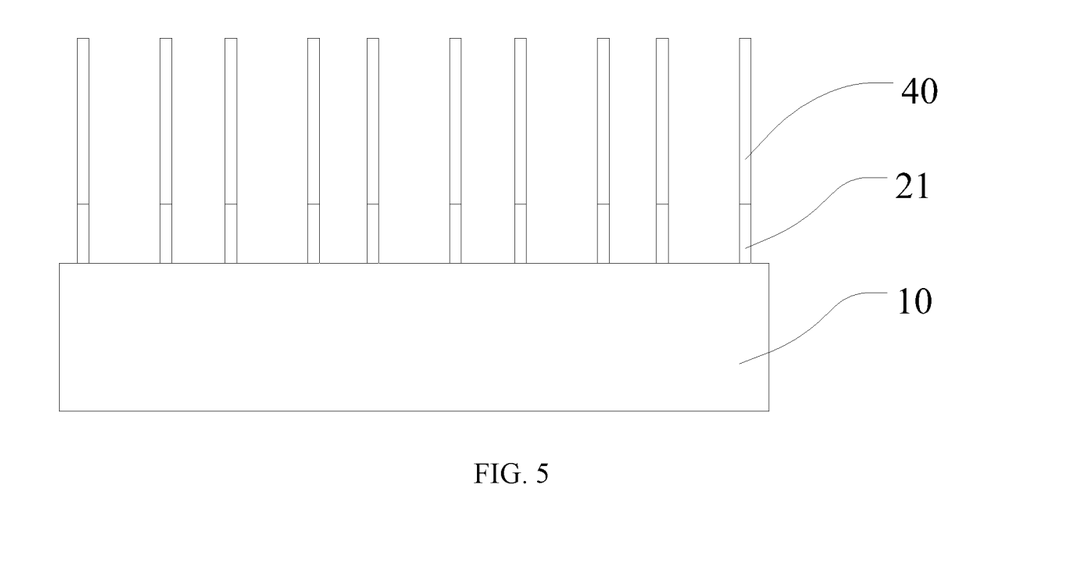

Referring to FIG. 5, the to-be-etched layer 20 is etched using the sidewall spacer 40 as a mask, such that the to-be-etched layer 20 forms a pattern 21.

According to the method described above, the sidewall spacer 40 is formed by etching a sidewall spacer material layer. By controlling the parameters of the deposition process, the thickness of the formed sidewall spacer material layer can be controlled. Generally, the thickness of the formed sidewall spacer material layer is small, and accordingly, t the formed sidewall spacer 40 may also have a small thickness, thereby satisfying the requirements of semiconductor structures that become smaller and smaller.

However, as the critical dimension of semiconductor structures becomes smaller and smaller, the limitations of the existing fabrication processes, such as exposure limit of photolithography process, material loss during etching process, etc., may easily lead to large roughness of the formed sidewall spacer 40 and an apex angle at the top of the sidewall spacer 40. That is, the profile of the formed sidewall spacer 40 may be undesired. As such, the profile of the pattern 21 formed by using the sidewall spacer 40 as the mask to etch the to-be-etched layer 20 may be undesired. In addition, the large roughness of the surface of the sidewall spacer 40 may further affect the precision of the formed pattern, thereby degrading the performance of the formed semiconductor structure.

It should be noted that the sidewall spacer 40 has a first side edge (not shown) and a second side edge (not shown) opposite to the first side edge, and the sidewall spacer 40 having an apex angle at the top refers to that the height of the first side edge is different from the height of the second side edge. That is, the top surface of the sidewall spacer 40 may have a non-zero angle with respect to the surface of the substrate 10.

To improve the profile of the formed pattern and improve the performance of the formed semiconductor structure, the present disclosure provides a method for forming a semiconductor structure. The method includes, providing a to-be-etched layer; forming a plurality of initial sidewall spacers on the to-be-etched layer; and performing at least one modification treatment process on the plurality of initial sidewall spacers to form a plurality of sidewall spacers on the to-be-etched layer. Each of the at least one modification treatment process includes modifying the plurality of initial sidewall spacers to form a transition layer on the top and sidewall surfaces of each initial sidewall spacer; and removing the transition layer by an atomic layer etching process. The disclosed method may be able to improve the performance of the formed semiconductor structure.

To make the aforementioned objectives, features, and beneficial effects of the present disclosure more comprehensible, specific embodiments of the present disclosure are described in detail with reference to the accompanying drawings.

Figure 16:
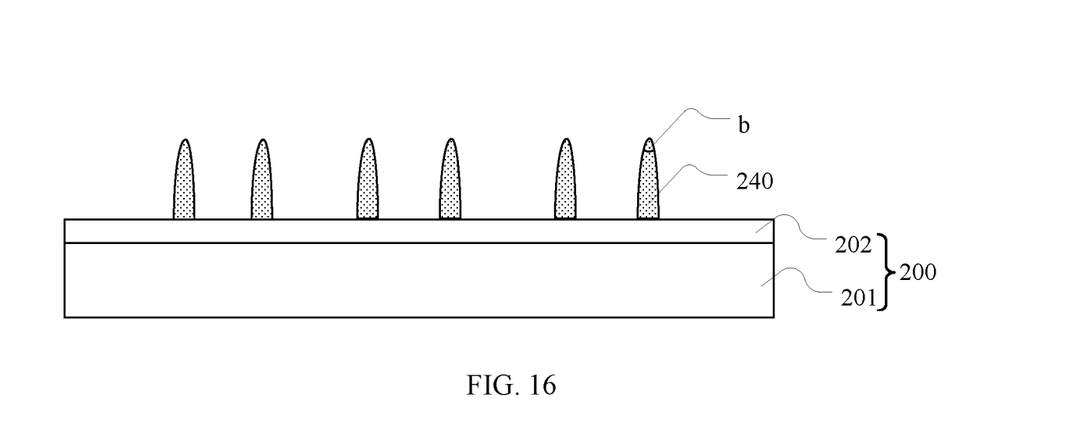
Figure 17:
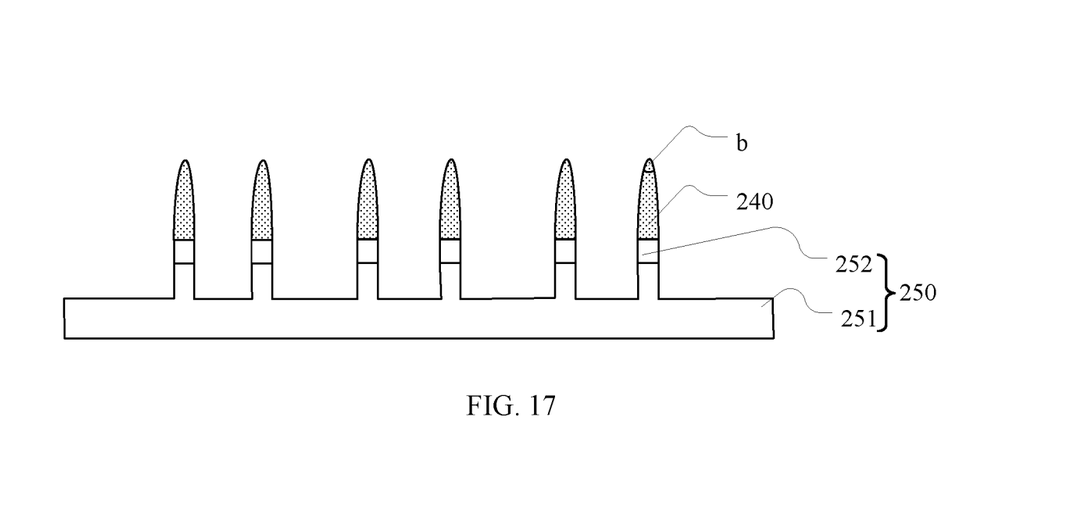
Figure 18:
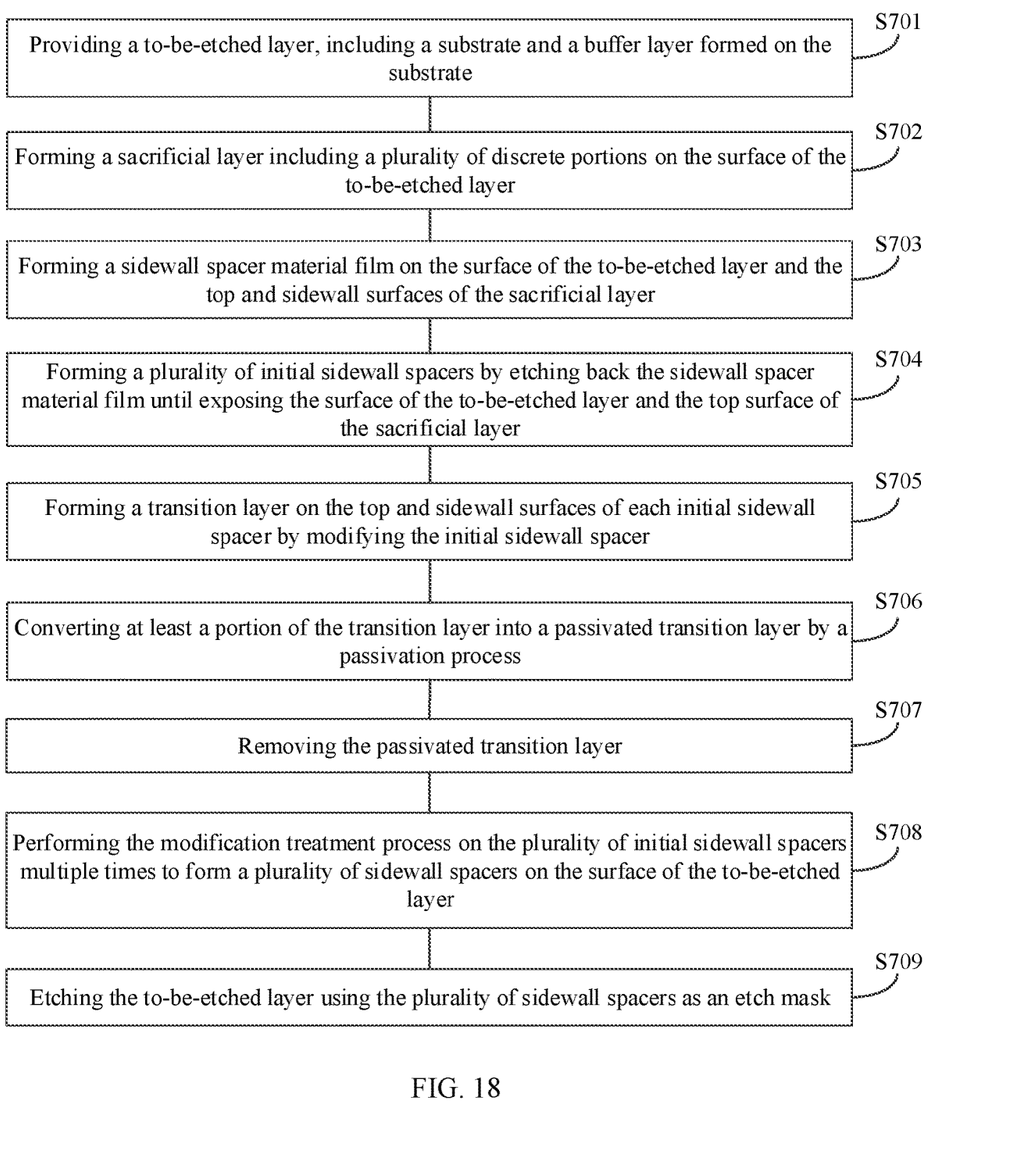
FIG. 18 illustrates a flowchart of an exemplary method for fabricating a semiconductor structure consistent with some embodiments of the present disclosure.

The present disclosure provides a method for forming a semiconductor structure. FIG. 18 illustrates a flowchart of an exemplary method for forming a semiconductor structure according to some embodiments of the present disclosure, and FIGS. 6-17 illustrate schematic cross-sectional views of semiconductor structures at certain stages of the exemplary method.

Figure 6:
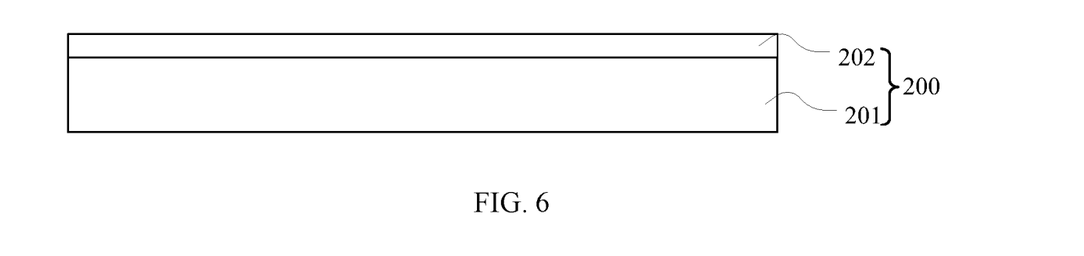
FIGS. 6-17 illustrate schematic cross-sectional views of semiconductor structures at certain stages of an exemplary method for fabricating a semiconductor structure consistent with some embodiments of the present disclosure.

Referring to FIG. 18, a to-be-etched layer, including a substrate and a buffer layer formed on the substrate, may be provided (S701). FIG. 6 illustrates a schematic cross-sectional view of a semiconductor structure consistent with various embodiments of the present disclosure.

Referring to FIG. 6, a to-be-etched layer 200 may be provided. The to-be-etched layer 200 may include a substrate 201 and a buffer layer 202 formed on the surface of the substrate 201. The buffer layer 202 may be used to protect the surface of the substrate 201, such that damage to the surface of the substrate 201 in subsequent fabrication processes may be reduced.

The substrate 201 may be made of a semiconductor material. In one embodiment, the substrate 201 may be made of silicon. In other embodiments, the substrate may be made of silicon carbide (SiC), silicon germanium (SiGe), a multi-element semiconductor material (or semiconductor compound) including Group III-V elements, silicon-on-insulator (SOI), or germanium-on-insulator (GOI). The multi-element semiconductor material including the Group III-V elements may include InP, GaAs, GaP, InAs, InSb, InGaAs, InGaAsP, or the like.

The buffer layer 202 may be made of silicon oxide ($SiO_x$), silicon nitride ($SiN_x$), silicon carbonitride (SiCN), silicon boronitride (SiBN), silicon carbon oxynitride (SiCON), or silicon oxynitride (SiON). In one embodiment, the buffer layer 202 may be made of silicon oxide ($SiO_x$).

Figure 7:
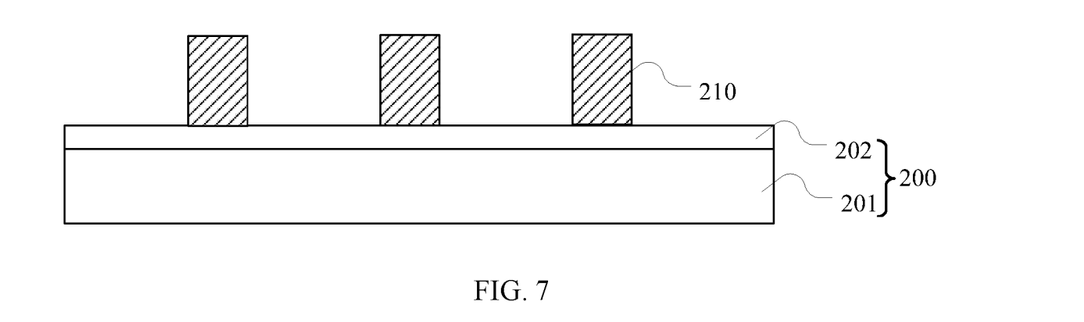

Further, returning to FIG. 18, a sacrificial layer including a plurality of discrete portions may be formed on the surface of the to-be-etched layer (S702). FIG. 7 illustrates a schematic cross-sectional view of a semiconductor structure consistent with various embodiments of the present disclosure.

Referring to FIG. 7, a sacrificial layer 210 including a plurality of discrete portions may be formed on the surface of the to-be-etched layer 200. In one embodiment, the sacrificial layer 210 may be formed by a self-aligned multiple patterning process.

For example, the process of forming the sacrificial layer 210 may include the following exemplary steps. A patterned layer including a plurality of discrete portions (not shown) may be formed on the surface of the to-be-etched layer 200. A sacrificial material layer (not shown) may be formed on the top and sidewall surfaces of the plurality of portions of the patterned layer. The sacrificial material layer may then be etched back until the surfaces of the to-be-etched layer 200 and the patterned layer are exposed. As such, a sacrificial layer 210 including a plurality of discrete portions may be formed on the surface of the to-be-etched layer 200. After forming the sacrificial layer 210, the patterned layer may be removed.

The sacrificial layer 210 may be made of a material including amorphous silicon, amorphous carbon, polycrystalline silicon, silicon oxide ($SiO_x$), silicon oxycarbide, or hydrogenated silicon oxycarbide (SiCOH). In other embodiments, the sacrificial layer may be formed by a photolithography process.

Figure 8:
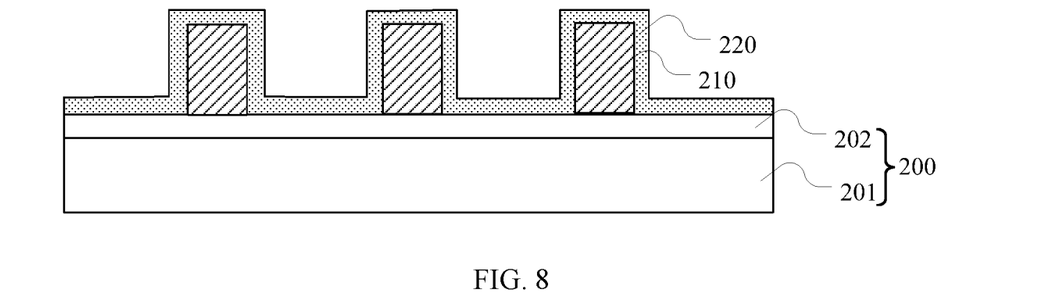

Further, returning to FIG. 18, a sidewall spacer material film may be formed on the surface of the to-be-etched layer and the top and the sidewall surfaces of the sacrificial layer (S703). FIG. 8 illustrates a schematic cross-sectional view of a semiconductor structure consistent with various embodiments of the present disclosure.

Referring to FIG. 8, a sidewall spacer material film 220 may be formed on the surface of the to-be-etched layer 200 and the top and the sidewall surfaces of the sacrificial layer 210. The sidewall spacer material layer 220 may be used to provide materials for subsequent formation of initial sidewall spacers. The sidewall spacer material film 220 may be made of a material including silicon oxide ($SiO_x$), silicon nitride ($SiN_x$), silicon carbonitride (SiCN), silicon boronitride (SiBN), silicon carbon oxynitride (SiCON), or silicon oxynitride (SiON). In one embodiment, the sidewall spacer material film 220 may be made of silicon nitride ($SiN_x$).

The process of forming the sidewall spacer material film 220 may include chemical vapor deposition (CVD), physical vapor deposition (PVD), or atomic layer deposition (ALD). In one embodiment, the sidewall spacer material film 220 may be formed by an ALD process. Using the ALD process for forming the sidewall spacer material film 220 may be conducive to forming a sidewall spacer material film 220 with uniform thickness and desired profile. Therefore, when further etching back the sidewall spacer material layer 220, a plurality of sidewall spacers with a uniform thickness and desired profile may be formed, which is conducive to improving the performance of the semiconductor structure.

Figure 9:
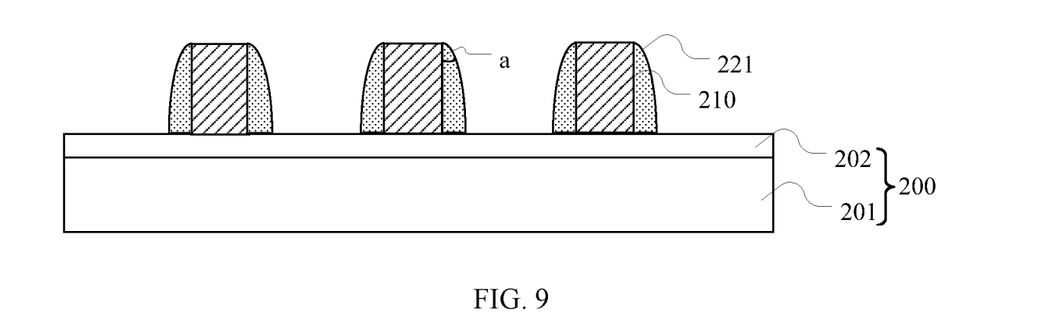

Further, returning to FIG. 18, a plurality of initial sidewall spacers may be formed by etching back the sidewall spacer material film until exposing the surface of the to-be-etched layer and the top surface of the sacrificial layer (S704). FIG. 9 illustrates a schematic cross-sectional view of a semiconductor structure consistent with various embodiments of the present disclosure.

Referring to FIG. 9, the sidewall spacer material film 220 may be etched back until the surface of the to-be-etched layer 200 and the top surface of the sacrificial layer 210 are exposed. As such a plurality of initial sidewall spacers 221 may be formed.

The surface roughness of the plurality of initial sidewall spacers may be a first roughness. Because of the limitations of existing etching processes, the first roughness of the initial sidewall spacer 221 may be large. The initial sidewall spacer 221 may have an apex angle 'a' at the top.

In one embodiment, the fabrication method may further include removing the sacrificial layer 210 after forming the plurality of initial sidewall spacers 221.

After forming the plurality of initial sidewall spacers 221, at least one modification treatment process may be performed on the plurality of initial sidewall spacers 221 to form sidewall spacers on the to-be-etched layer 200. Each modification treatment process may include modifying the plurality of initial sidewall spacers 221 to form a transition layer on the top and sidewall surfaces of each initial sidewall spacer 221; and removing the transition layer by an atomic layer etching process.

Figure 10:
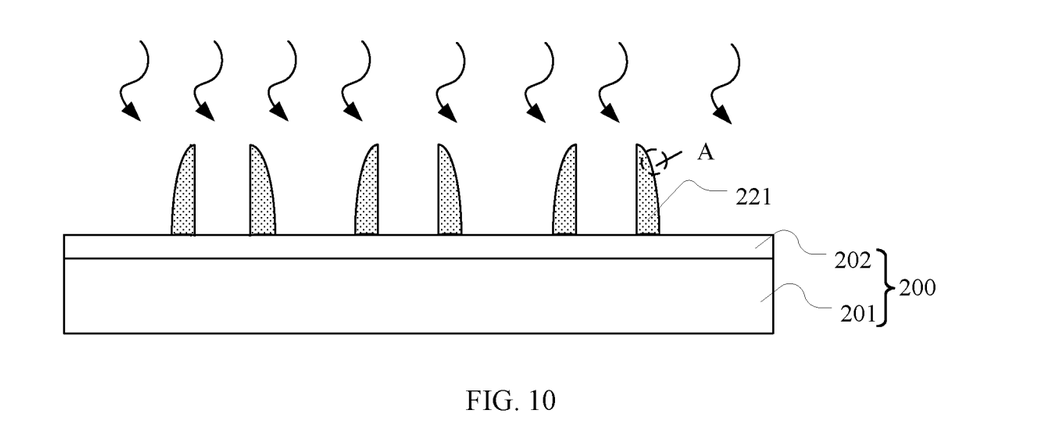
Figure 11:
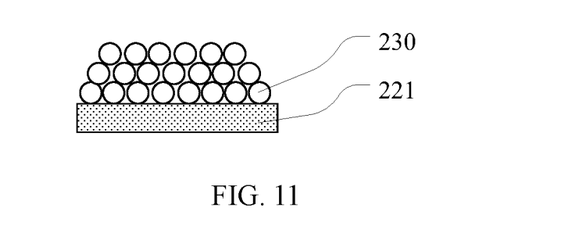

For example, returning to FIG. 18, a transition layer may be formed on the top and sidewall surfaces of each initial sidewall spacer by modifying the initial sidewall spacer (S705). FIGS. 10-11 illustrate schematic cross-sectional views of a semiconductor structure consistent with various embodiments of the present disclosure. Specifically, FIG. 11 illustrates an enlarged view of a local area 'A' in FIG. 10.

Referring to FIGS. 10-11, the plurality of initial sidewall spacers 221 may be subjected to modification treatment, such that a transition layer 230 may be formed on the top and sidewall surfaces of each initial sidewall spacer 221.

In one embodiment, the modifying the plurality of initial sidewall spacers 221 may include a plasma treatment process. The gas used in the modification treatment process may include oxygen.

For example, in one embodiment, the processing parameters used in the plasma to treatment process may include a processing gas including $O_2$, Ar, and $C_4H_6$; a pressure in a range of approximately 10 mTorr to 50 mTorr; a gas flow rate of each of $O_2$, Ar, and $C_4H_6$ in a range of approximately 5 sccm to 800 sccm; a radio frequency (RF) power in a range of approximately 30 W to 500 W; and a bias power in a range of approximately 10 W to 200 W.

In one embodiment, because the plurality of initial sidewall spacers 221 is made of silicon nitride ($SiN_x$), after performing the modification treatment process, the formed transition layer 230 may be made of a material including Si—O—N group.

Forming the transition layer 230 formed by performing a modification treatment process on the plurality of initial sidewall spacers 221 may be able to improve the top morphology of each initial sidewall spacer 221. In the meantime, the transition layer 230 may also be able to reduce the roughness of the sidewall surfaces of the plurality of initial sidewall spacers 221.

For example, by performing the modification treatment process, when the processing gas used for the modification treatment reacts with the top portion of each initial sidewall spacer 221 to form the transition layer 230, because of the apex angle at the top of each initial sidewall spacer 221, the degree of the reaction between the processing gas and the protruding portion at the top of each initial sidewall spacer 221 may be greater than the degree of the reaction between the processing gas and the non-protruding portion of the initial sidewall spacer 221, such that the difference between the top protruding portion and the smooth portion may be reduced. Therefore, the top morphology of the formed initial sidewall spacer 221 may be improved, and thus after removing the transition layer 230 in a subsequent process, the formed sidewall spacer may have a rounded angle at the top. That is, the profile of the sidewall spacer may be improved, which may further ensure desired performance of the formed semiconductor structure.

For example, during the modification treatment process, when the processing gas reacts with the sidewall of the initial sidewall spacer 221 to form the transition layer 230, due to the uneven surface of the initial sidewall spacer 221, the degree of the reaction between the processing gas and the protruding portion of the sidewall surface may be greater than the degree of the reaction between the processing gas and the recessed portion of the sidewall surface, such that the difference between the protruding portion and the recessed portion may be reduced. Therefore, the roughness of the initial sidewall spacer 221 may be reduced, and thus a second roughness of the sidewall spacer formed after subsequently removing the transition layer 230 may be smaller than the first roughness. As such, the modification treatment process may be conductive to improving the performance of the formed semiconductor structure.

In one embodiment, by performing a modification treatment process, a surface portion of each initial sidewall spacer 221 may be converted to the transition layer 230, that is, a surface portion of each initial sidewall spacer 221 may be consumed. Further, after subsequently removing the transition layer to form the sidewall spacer, the dimension of the formed sidewall spacer may be smaller than the dimension of the initial sidewall spacer 221, which may be conductive to forming a semiconductor structure with further reduced critical dimension, thereby improving the performance of the formed semiconductor structure.

Further, the transition layer formed after the modification treatment may be removed by an atomic layer etching process. The atomic layer etching process may include passivating the transition layer; and removing the passivated transition layer by etching. In the following, the removal of the transition layer will be described in detail with reference to accompanying drawings.

Figure 12:
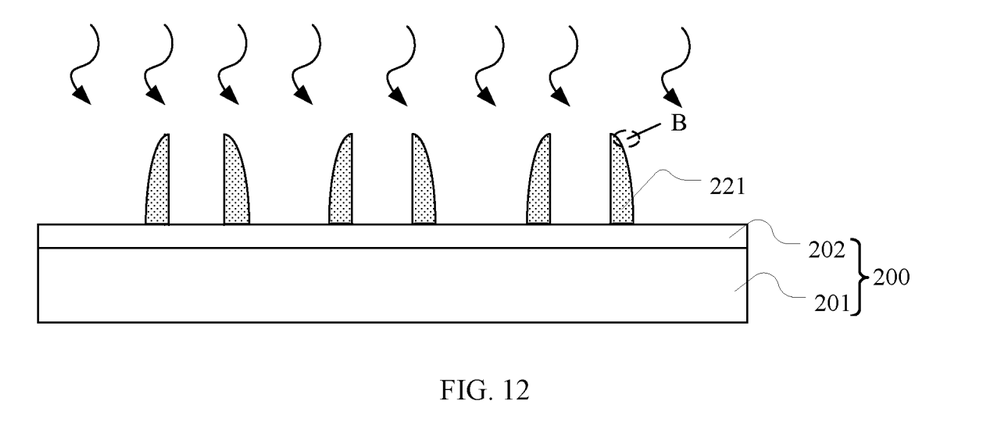
Figure 13:
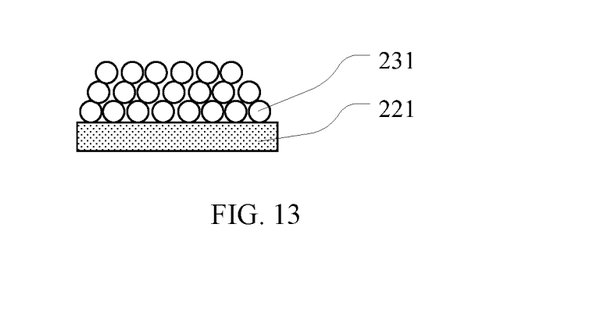

Returning to FIG. 18, at least a portion of the transition layer may be converted into a passivated transition layer by a passivation process (S706). FIGS. 12-13 illustrate schematic cross-sectional views of a semiconductor structure consistent with various embodiments of the present disclosure. Specifically, FIG. 13 illustrates an enlarged view of a local area 'B' in FIG. 12.

Referring to FIGS. 12-13, a passivation gas may be used to react with the transition layer 230 formed on the surface of the initial sidewall spacer 221, such that at least a portion of the transition layer 230 may be converted into a passivated transition layer 231. In one embodiment, the transition layer 230 on the surface of each initial sidewall spacer 221 may form a passivated transition layer 231. In one embodiment, the passivation gas may include a carbon fluoride gas, and the carbon fluoride gas may include $C_4F_6$, $CH_3F$, $CHF_3$, or a combination thereof.

In one embodiment, the passivated transition layer may be removed by repeatedly performing passivating the transition layer and etching the passivated transition layer.

Figure 14:
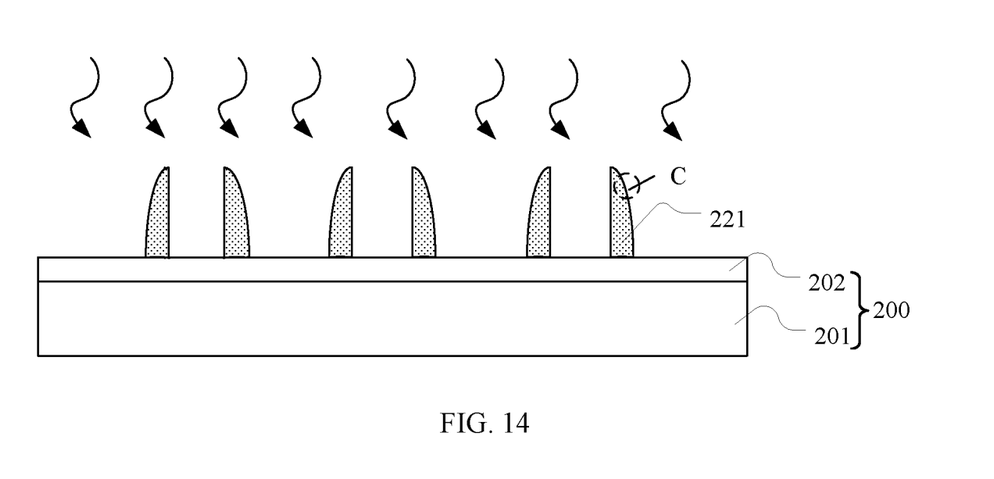
Figure 15:
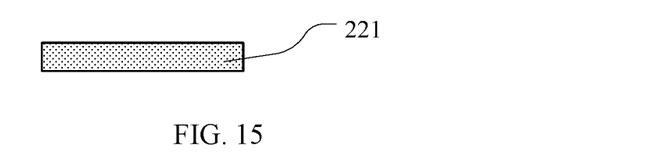

Further, returning to FIG. 18, the passivated transition layer may be removed (S707). FIGS. 14-15 illustrate schematic cross-sectional views of a semiconductor structure consistent with various embodiments of the present disclosure. Specifically, FIG. 15 illustrates an enlarged view of a local area 'C' in FIG. 14.

Referring to FIGS. 14-15, an etching gas may be used to react with the passivated transition layer 231, such that the passivated transition layer 231 may be removed. The etching gas used for removing the passivated transition layer 231 may include argon (Ar) or helium (He).

During the atomic layer etching process, the RF bias power may not be too large or too small. When the RF bias power is smaller than 10 W, the reaction rate of the etching process may be too small, which is detrimental to improving the production speed. However, a bias power larger than 250 W may be adverse to the control of the reaction rate of the etching process. In addition, the large bias power may also lead to an excessively large penetration depth for the ions, which likely causes excessive consumption of the initial sidewall spacer 221, and thus reduces the accuracy of the critical dimension of the formed sidewall spacer. Therefore, in one embodiment, the RF bias power used in the atomic layer etching process may be in a range of approximately 10 W to 250 W.

In one embodiment, during the atomic layer etching process, the ratio of the etching rate on the transition layer 230 to the etching rate on the initial sidewall spacer 221 may be large, and the ratio of the etching rate on the transition layer 230 to the etching rate on the to-be-etched layer 200 may be large. As such, while ensuring the transition layer 230 is removed, the atomic layer etching process may have limited damage to the initial sidewall spacer 221 and the to-be-etched layer 200, thereby conducive to improving the stability of the pattern transfer.

By using the atomic layer etching process to remove the transition layer 230, the atomic etching process may be able to etch the transition layer 230 at an atomic level, that is, the transition layer 230 may be accurately removed.

Further, returning to FIG. 18, the plurality of initial sidewall spacers may be subjected to multiple times of the modification treatment process to form a plurality of sidewall spacers on the surface of the to-be-etched layer (S708). FIG. 16 illustrates a schematic cross-sectional view of a semiconductor structure consistent with various embodiments of the present disclosure.

Referring to FIG. 16, the plurality of initial sidewall spacers 221 may be subjected to multiple times of the modification treatment process to form a plurality of sidewall spacers 240 on the surface of the to-be-etched layer 200.

After performing the modification treatment process on the plurality of initial sidewall spacers 221 multiple times to form the plurality of sidewall spacers 240 on the to-be-etched layer 200, the surface roughness of the plurality of sidewall spacers 240 may be a second roughness. The second roughness may be smaller than the first roughness of the plurality of initial sidewall spacers 221.

Forming the transition layer 230 by performing a modification treatment process on the plurality of initial sidewall spacers 221 may be able to improve the top morphology of each initial sidewall spacer 221. In the meantime, the transition layer 230 may also be able to reduce the roughness of the sidewall surfaces of the plurality of initial sidewall spacers 221. By using the atomic layer etching process to remove the transition layer 230, the atomic etching process may be able to etch the transition layer 230 at an atomic level, that is, the transition layer 230 may be accurately removed. As such, desired top morphology may be ensured for the formed sidewall spacer 240, and the roughness of the surface of the sidewall surface of the formed sidewall spacer 240 may be reduced. Therefore, the disclosed method may be able to form a plurality of sidewall spacers 240 with desired top morphology and a small sidewall roughness, which may further improve the performance of the formed semiconductor structure.

In one embodiment, after forming the plurality of sidewall spacers 240, each sidewall spacer 240 may have a rounded angle 'b' at the top. It should be noted that the sidewall spacer 240 has a first side edge (not shown) and a second side edge (not shown) opposite to the first side edge, and the sidewall spacer 240 having a rounded angle at the top refers to that the height of the first side edge is equal or similar to the height of the second side edge.

Further, returning to FIG. 18, after forming the plurality of sidewall spacers, the to-be-etched layer may be etched using the plurality of sidewall spacers as an etch mask (S709). FIG. 17 illustrates a schematic cross-sectional view of a semiconductor structure consistent with various embodiments of the present disclosure.

Referring to FIG. 17, after forming the plurality of sidewall spacers 240, the to-be-etched layer 200 may then be etched using the plurality of sidewall spacers 240 as an etch mask. Because the plurality of sidewall spacer 240 has desired top morphology and the roughness of the sidewall surface of each sidewall spacer 240 is small, when etching the to-be-etched layer 200, using the plurality of sidewall spacers 240 as the etch mask may be able to improve the accuracy of the pattern transfer.

In other embodiments, the method for forming the semiconductor structure may include: after forming the plurality of sidewall spacers, forming a plurality of additional sidewall spacers on the surface of the to-be-etched layer to cover the sidewall surface of each sidewall spacer; after forming the plurality of additional sidewall spacers, removing the plurality of sidewall spacers; and then, etching the to-be-etched layer using the plurality of additional sidewall spacers as an etch mask.

The process of forming the plurality of additional sidewall spacers may include: forming an additional sidewall material film on the surface of the to-be-etched layer and the top and sidewall surfaces of each sidewall spacer; etching back the additional sidewall material film until exposing the top surface of the sidewall spacer and the surface of the to-be-etched layer. As such, the plurality of additional sidewall spacers may be formed on the sidewall surface of each sidewall spacer.

Correspondingly, the present disclosure also provides a semiconductor structure formed by the disclosed method. FIG. 16 illustrates a schematic cross-sectional view of a semiconductor structure consistent with various embodiments of the present disclosure.

Referring to FIG. 16, the semiconductor structure may include a to-be-etched layer 200, and a plurality of sidewall spacers 240 formed on the to-be-etched layer 200. Each sidewall spacer 240 may have a rounded angle 'b' at the top. It should be noted that the sidewall spacer 240 has a first side edge (not shown) and a second side edge (not shown) opposite to the first side edge, and the sidewall spacer 240 having a rounded angle at the top refers to that the height of the first side edge is equal or similar to the height of the second side edge.

Compared to existing semiconductor structures and fabrication methods, the disclosed semiconductor structures and fabrication methods may demonstrate the following exemplary advantages.

According to the disclosed methods, forming the transition layer by performing a modification treatment process on the plurality of initial sidewall spacers can improve the top morphology of each initial sidewall spacer. In the meantime, the transition layer can also reduce the roughness of the sidewall surfaces of the plurality of initial sidewall spacers. By using an atomic layer etching process to remove the transition layer, the transition layer can be etched at an atomic level, and thus the transition layer may be accurately removed. As such, desired top morphology may be ensured for the formed sidewall spacer, and the roughness of the surface of the sidewall surface of the formed sidewall spacer may be reduced. Therefore, the disclosed method may be able to form a plurality of sidewall spacers with desired top morphology and a small sidewall roughness, which may further improve the performance of the formed semiconductor structure.

Further, by performing a modification treatment process, a surface portion of each initial sidewall spacer is converted to a transition layer, that is, a surface portion of each initial sidewall spacer is consumed. Further, after subsequently removing the transition layer to form a plurality of sidewall spacers, the dimension of the formed sidewall spacer may be smaller than the dimension of the initial sidewall spacer, which may be conductive to forming a semiconductor structure with further reduced critical dimension, thereby improving the performance of the formed semiconductor structure.

Further, by performing the modification treatment process, when the processing gas used for the modification treatment reacts with the top portion of each initial sidewall spacer to form the transition layer, because of the apex angle at the top of each initial sidewall spacer, the degree of the reaction between the processing gas and the protruding portion at the top of each initial sidewall spacer may be greater than the degree of the reaction between the processing gas and the non-protruding portion of the initial sidewall spacer, such that the difference between the top protruding portion and the smooth portion may be reduced. Therefore, the top morphology of the formed initial sidewall spacer may be improved, and thus after removing the transition layer in a subsequent process, the formed sidewall spacer may have a rounded angle at the top. That is, the profile of the sidewall spacer may be improved, which may further ensure desired performance of the formed semiconductor structure.

Further, during the modification treatment process, when the processing gas reacts with the sidewall of the initial sidewall spacer to form the transition layer, due to the uneven surface of the initial sidewall spacer, the degree of the reaction between the processing gas and the protruding portion of the sidewall surface may be greater than the degree of the reaction between the processing gas and the recessed portion of the sidewall surface, such that the difference between the protruding portion and the recessed portion may be reduced. Therefore, the roughness of the initial sidewall spacer may be reduced, and thus a second roughness of the sidewall spacer formed after subsequently removing the transition layer may be smaller than the first roughness. As such, the modification treatment process may be conductive to improving the performance of the formed semiconductor structure.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for forming a semiconductor structure, comprising:
    providing a to-be-etched layer;
    forming a sacrificial layer, including a plurality of discrete portions;
    forming a sidewall material film on a surface of the to-be-etched layer and on top and sidewall surfaces of the sacrificial layer;
    etching back the sidewall material film until exposing the surface of the to-be-etched layer and the top surface of the sacrificial layer to form a plurality of initial sidewall spacers;
    removing the sacrificial layer after forming the plurality of initial sidewall spacers; and
    after removing the sacrificial layer, performing at least one modification treatment process on the plurality of initial sidewall spacers to form a plurality of sidewall spacers, wherein each of the at least one modification treatment process includes:
        modifying the plurality of initial sidewall spacers to form a transition layer on top and sidewall surfaces of each initial sidewall spacer of the plurality of initial sidewall spacers,
        passivating the transition layer to convert at least a portion of the transition layer into a passivated transition layer using a passivation gas to react with a surface of the transition layer; and
        etching the passivated transition layer using an etching gas to react with the passivated transition layer to remove the passivated transition layer.

2. The method according to claim 1, wherein:
    a surface roughness of the plurality of initial sidewall spacers is a first roughness; and
    a surface roughness of the plurality of sidewall spacers is a second roughness, wherein:
        the first roughness is larger than the second roughness.

3. The method according to claim 1, wherein:
    each initial sidewall spacer of the plurality of initial sidewall spacers has an apex angle at top; and
    each sidewall spacer of the plurality of sidewall spacers has a rounded angle at top.

4. The method according to claim 1, wherein:
    modifying the plurality of initial sidewall spacers includes a plasma treatment process.

5. The method according to claim 4, wherein:
    the plurality of initial sidewall spacers is made of silicon nitride ($SiN_x$); and
    a gas used in the modification treatment process includes oxygen ($O_2$).

6. The method according to claim 5, wherein processing parameters of the plasma treatment process include:
    a processing gas including $O_2$, Ar, and $C_4H_6$;
    a pressure in a range of approximately 10 mTorr to 50 mTorr;
    a gas flow rate of each of $O_2$, Ar, and $C_4H_6$ in a range of approximately 5 sccm to 800 sccm;
    a radio frequency (RF) power in a range of approximately 30 W to 500 W; and
    a bias power in a range of approximately 10 W to 200 W.

7. The method according to claim 1, wherein:
    removing the transition layer includes repeatedly performing passivating the transition layer and etching the passivated transition layer.

8. The method according to claim 1, wherein:
    the transition layer is made of a material including Si—O—N group.

9. The method according to claim 8, wherein:
    the passivation gas includes a carbon fluoride gas, including $C_4F_6$, $CH_3F$, $CHF_3$, or a combination thereof.

10. The method according to claim 8, wherein:
    the etching gas includes argon (Ar) or helium (He).

11. The method according to claim 8, wherein:
a bias power used in the atomic layer etching process is in a range of approximately 10 W to 250 W.

12. The method according to claim 1, wherein:
the to-be-etched layer includes a substrate and a buffer layer formed on the substrate.

13. The method according to claim 12, wherein:
the plurality of discrete portions of the sacrificial layer are formed on the buffer layer,
the sidewall material film is formed on a surface of the buffer layer, and
the sidewall material film is etched to expose the surface of the buffer layer.

14. The method according to claim 1, wherein forming the plurality of initial sidewall spacers includes:
forming a sacrificial layer, including a plurality of discrete portions;
forming a sidewall material film on a surface of the to-be-etched layer and on top and sidewall surfaces of the sacrificial layer;
etching back the sidewall material film until exposing the surface of the to-be-etched layer and the top surface of the sacrificial layer to form the plurality of initial sidewall spacers; and
removing the sacrificial layer after forming the plurality of initial sidewall spacers.

15. The method according to claim 14, wherein:
the sacrificial layer is formed by a self-aligned multiple patterning process.

16. The method according to claim 15, after forming the plurality of sidewall spaces, further including:
etching the to-be-etched layer using the plurality of sidewall spacers as an etch mask.

17. The method according to claim 1, further including:
after forming the plurality of sidewall spacers, forming a plurality of additional sidewall spacers on a surface of the to-be-etched layer to cover a sidewall surface of each sidewall spacer;
after forming the plurality of additional sidewall spacers, removing the plurality of sidewall spacers; and
etching the to-be-etched layer using the plurality of additional sidewall spacers as an etch mask.

18. The method according to claim 17, wherein forming the plurality of additional sidewall spacers includes:
forming an additional sidewall material film on the surface of the to-be-etched layer and on top and sidewall surfaces of each sidewall spacer; and
etching back the additional sidewall material film until exposing the top surface of the sidewall spacer and the surface of the to-be-etched layer to form the plurality of additional sidewall spacers.

* * * * *